(12) United States Patent
Kawahara et al.

(10) Patent No.: US 11,410,865 B2
(45) Date of Patent: Aug. 9, 2022

(54) SUBSTRATE PROCESSING APPARATUS

(71) Applicant: SCREEN Holdings Co., Ltd., Kyoto (JP)

(72) Inventors: Hiroyuki Kawahara, Kyoto (JP); Koji Hashimoto, Kyoto (JP); Noriyuki Kikumoto, Kyoto (JP); Noritake Sumi, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 261 days.

(21) Appl. No.: 15/931,559

(22) Filed: May 13, 2020

(65) Prior Publication Data

US 2020/0365437 A1 Nov. 19, 2020

(30) Foreign Application Priority Data

May 17, 2019 (JP) .............................. JP2019-093622

(51) Int. Cl.
| | |
|---|---|
| *H01L 21/67* | (2006.01) |
| *H01L 21/677* | (2006.01) |
| *H01L 21/687* | (2006.01) |
| *B08B 7/00* | (2006.01) |
| *H01L 21/02* | (2006.01) |
| *B08B 3/08* | (2006.01) |

(52) U.S. Cl.
CPC ......... *H01L 21/67742* (2013.01); *B08B 3/08* (2013.01); *B08B 7/0021* (2013.01); *H01L 21/02041* (2013.01); *H01L 21/67051* (2013.01); *H01L 21/67748* (2013.01); *H01L 21/67751* (2013.01); *H01L 21/68707* (2013.01)

(58) Field of Classification Search
CPC .................................................. H01L 21/67742
See application file for complete search history.

(56) References Cited

U.S. PATENT DOCUMENTS

| 6,682,629 B2 | 1/2004 | Kudo et al. |
| 8,083,463 B2 | 12/2011 | Jhong et al. |
| 2003/0183250 A1 | 10/2003 | Rodney Chiu et al. |

FOREIGN PATENT DOCUMENTS

| EP | 3355117 | 8/2018 |
| JP | 2003092244 | 3/2003 |
| TW | 568347 | 12/2003 |
| TW | 201013760 | 4/2010 |
| TW | 201834010 | 9/2018 |

*Primary Examiner* — Jason Y Ko
(74) *Attorney, Agent, or Firm* — JCIPRNET

(57) ABSTRACT

A substrate processing apparatus includes a base portion 1541 that is disposed in a manner of being adjacent to a chamber; a hand 155 that holds a substrate S; an arm 1542 that is attached to the base portion 1541, supports the hand, and moves the hand forward and rearward by horizontally moving the hand with respect to the base portion; and a cover portion 156 that accommodates the hand in an internal space. The cover portion has a cover main body 1561 forming the internal space and an extending member 1562 having a hollow structure which penetrates the cover portion in a horizontal direction and of which one end serves as an opening 1562a and being engaged with the cover main body in a state of being movable in the horizontal direction while the opening communicates with the internal space.

15 Claims, 10 Drawing Sheets

SUBSTRATE PROCESSING APPARATUS

CROSS REFERENCE TO RELATED APPLICATION

The disclosure of Japanese Patent Application No. 2019-093622 filed on May 17, 2019 including specification, drawings and claims is incorporated herein by reference in its entirety.

BACKGROUND

1. Technical Field

The disclosure relates to a substrate processing apparatus for transferring a substrate filled with a liquid between a plurality of chambers.

2. Description of the Related Art

In a step of processing various kinds of substrates such as semiconductor substrates and glass substrates for a display device, when processing for substrates is executed sequentially in a plurality of chambers, it is necessary to transfer a substrate between the chambers. In this case, for the purpose of preventing exposure of a substrate surface, collapse of a fine pattern formed on a surface, and the like, a substrate may be transferred in a state in which the substrate in a horizontal posture is filled with a liquid, that is, an upper surface of the substrate is covered with a liquid film. In such a conveyance form, when a liquid is washed away from a substrate or a liquid evaporates during conveyance, a substrate surface may be exposed or a liquid component may scatter around and adhere to the inside of an apparatus, which becomes a problem.

In order to cope with this problem, for example, in the technology disclosed in Japanese Patent Laid-Open No. 2003-092244 (Patent Document 1), a transfer robot for transferring a substrate is entirely covered with a cover. Moreover, a hand for holding a substrate is accommodated in a case provided inside the cover. Accordingly, a liquid on a substrate is prevented from leaking out. Further, the hand is configured to move forward to the outside from the case only when a substrate accesses a chamber.

Due to the nature of operation in which a plurality of substrates are transferred between chambers, in addition to forward and rearward movement of a hand for carrying a substrate into the chamber and carrying out the substrate from the chamber, it is necessary for a transfer robot main body to move with respect to the chamber and to be positionally set at a predetermined position.

For this reason, in an apparatus of the foregoing technology in the related art, it is necessary to provide a gap for avoiding interference between a transfer robot and a chamber. Therefore, when a substrate is delivered between the transfer robot and the chamber, the substrate is temporarily in a state in which it is exposed from a cover so that it is not protected. In addition, since the entire transfer robot is housed in the cover, there is also a problem that a substrate processing apparatus in its entirety including the transfer robot is increased in size. Thus, regarding a task of preventing scattering of a liquid from a substrate during conveyance, there still remains room for improvement in the foregoing technology in the related art from a practical aspect.

The disclosure provides a technology which is capable of realizing conveyance of a substrate between chambers while scattering of a liquid is reliably prevented in a substrate processing apparatus for transferring a substrate filled with a liquid between chambers.

SUMMARY

According to an aspect of the disclosure, there is provided a substrate processing apparatus for transferring a substrate in which a liquid film is formed on an upper surface. The substrate processing apparatus includes a chamber, a base portion that is adjacent to the chamber, a hand that holds the substrate, an arm that is attached to the base portion and is capable of moving the hand forward and rearward with respect to the chamber by moving the hand in a horizontal direction with respect to the base portion, and a cover portion that has an internal space capable of accommodating the hand for holding the substrate and has an opening through which the hand moving forward and rearward in accordance with the arm passes on a side portion.

Further, the cover portion has a cover main body forming the internal space and an extending member having a hollow structure which penetrates the cover portion in the horizontal direction and of which one end serves as the opening and being engaged with the cover main body in a state of being movable in the horizontal direction while the opening communicates with the internal space. Moreover, the arm causes the hand to enter the chamber from the internal space via the opening in a state in which the extending member has moved forward to the chamber side.

In the disclosure having such a configuration, the cover main body and the chamber can be connected to each other by the extending member moving forward and rearward from the cover main body toward the chamber side. Accordingly, the internal space of the chamber and the internal space of the cover portion can communicate with each other. For this reason, in a process of transferring a substrate by the hand moving between the inside of the cover portion and the inside of the chamber, a substrate held by the hand does not have to be exposed to a surrounding space. Therefore, even if a liquid on a substrate spills or evaporates during conveyance, the liquid is prevented from scattering in a surrounding space.

In addition, when the extending member performs a retreat movement to the cover main body side, the cover portion and the chamber become isolated from each other. Therefore, the cover portion can also be moved as necessary while interference with the chamber is avoided. Accordingly, it is possible to realize conveyance of a substrate between the chambers with a high degree of freedom.

In addition, according to another aspect of the disclosure, there is provided a substrate processing apparatus including a first chamber and a second chamber that serve as chambers. The substrate having the liquid film formed thereon is transferred from the first chamber to the second chamber.

In the disclosure having such a configuration, a substrate in which a liquid film is formed on an upper surface is transferred from the first chamber to the second chamber as described above. For this reason, a substrate can be transferred without causing a liquid configuring the liquid film to scatter therearound, and processing in the second chamber can be favorably performed.

DESCRIPTION OF THE EMBODIMENT

Figure 1A:
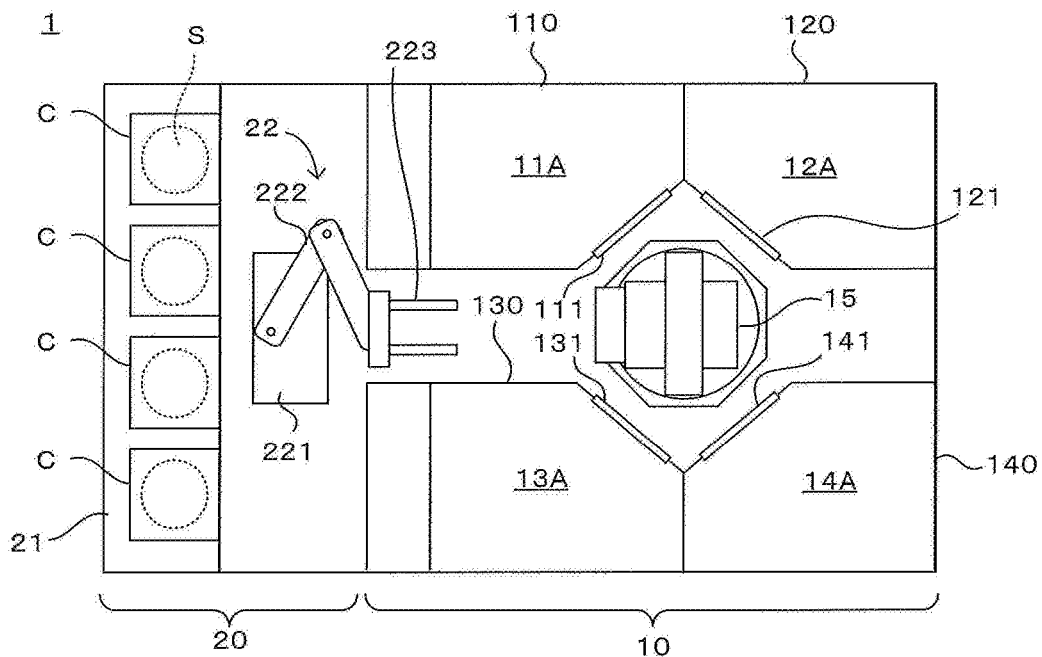
FIG. 1A is a plan view illustrating a substrate processing apparatus as an embodiment of the disclosure.

As described above, in the disclosure, while the hand for holding a substrate is accommodated in the cover main body, when the hand enters the chamber, the extending member is moved forward to the chamber side, and the internal space of the cover main body and the internal space of the chamber are connected to each other. For this reason, it is possible to realize conveyance of a substrate between the chambers while scattering of a liquid is reliably prevented.

The above and further objects and novel features of the disclosure will more fully appear from the following detailed description when the same is read in connection with the accompanying drawing. It is to be expressly understood, however, that the drawing is for purpose of illustration only and is not intended as a definition of the limits of the disclosure.

Figure 1B:
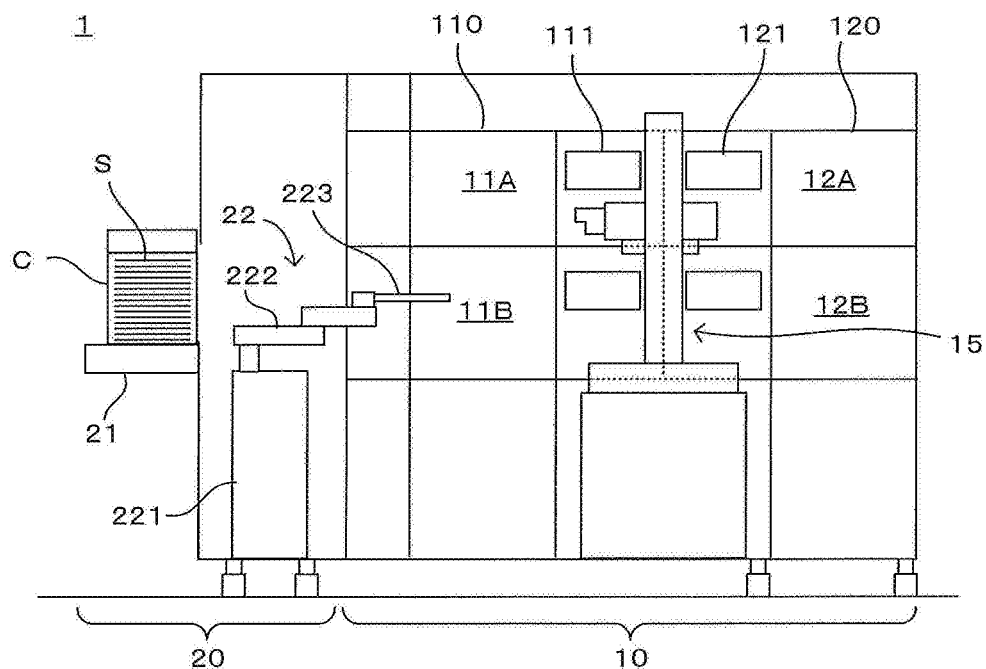
FIG. 1B is a side view of the substrate processing apparatus.

FIGS. 1A and 1B are views illustrating a schematic configuration of an embodiment of a substrate processing apparatus according to the disclosure. More specifically, FIG. 1A is a plan view illustrating a substrate processing apparatus 1 as an embodiment of the disclosure, and FIG. 1B is a side view illustrating the substrate processing apparatus 1. These diagrams are schematic views not illustrating the appearance of the apparatus but making an internal structure thereof easy to understand by removing an outer wall panel and some of other configurations of the apparatus. For example, this substrate processing apparatus 1 is an apparatus which is installed inside a cleanroom and performs predetermined processing for a substrate.

Here, as "a substrate" in the present embodiment, it is possible to apply various kinds of substrates such as a semiconductor substrate, a glass substrate for a photo-mask, a glass substrate for a liquid crystal display, a glass substrate for a plasma display, a substrate for a field emission display (FED), a substrate for an optical disc, a substrate for a magnetic disk, and a substrate for a magneto-optical disk. Hereinafter, a substrate processing apparatus which is mainly used for processing of semiconductor substrates will be described as an example with reference to the drawings. However, the present embodiment can also be similarly applied to processing of the various kinds of substrates exemplified above.

As illustrated in FIG. 1A, the substrate processing apparatus 1 includes a substrate processing section 10 that performs processing for a substrate S, and an indexer section 20 that is joined to this substrate processing section 10. The indexer section 20 includes a container holding portion 21 and an indexer robot 22. The container holding portion 21 can hold a plurality of containers C (front opening unified pods (FOUPs) accommodating a plurality of substrates S in a sealed state, standard mechanical interface (SMIF) pods, open cassettes (OCs), and the like) for accommodating the substrates S. The indexer robot 22 accesses the container C held by the container holding portion 21 to take out an unprocessed substrate S from the container C or store a processed substrate in the container C. Each container C accommodates a plurality of substrates S substantially in a horizontal posture.

The indexer robot 22 includes a base portion 221 that is fixed to an apparatus casing, an articulated arm 222 that is provided such that it can turn around a vertical axis with respect to the base portion 221, and a hand 223 that is attached to a tip of the articulated arm 222. The hand 223 has a structure in which the substrate S can be placed and held on an upper surface thereof. Indexer robots having such articulated arms and hands for holding a substrate are known, so that detailed description thereof will be omitted.

The substrate processing section 10 includes a center robot 15 that is disposed substantially in the middle in a plan view, and a plurality of substrate processing units that are disposed such that this center robot 15 is surrounded. Specifically, a plurality (four in this example) of substrate processing units 11A, 12A, 13A, and 14A are disposed such that they face a space in which the center robot 15 is disposed. Each of these substrate processing units 11A to 14A executes predetermined processing for the substrate S. When these processing units have the same function, parallel processing of a plurality of substrates can be performed. In addition, it is possible to adopt a configuration in which processing units having different functions are combined and different kinds of processing are sequentially executed for one substrate.

As described below, the substrate processing apparatus 1 of this embodiment is used in a series of processing in which the substrate S is subjected to wet processing using a predetermined processing liquid and the substrate S is dried thereafter. For this purpose, two substrate processing units 11A and 12A of four substrate processing units play a role of wet processing for the substrate S and internally have a configuration to be able to realize this. In addition, the two remaining substrate processing units 13A and 14A play a role of processing of removing a residual liquid from the wet-processed substrate S and drying the substrate S (dry processing) and internally have a configuration to be able to realize this.

In each of the substrate processing units 11A to 14A, a substrate processing main agent for executing processing for the substrate S is accommodated inside a processing chamber in which an openable shutter is provided on a side surface facing the center robot 15. That is, the substrate processing unit 11A has a processing chamber 110 and a shutter 111 that is provided on a side surface facing the center robot 15 of the processing chamber 110. The shutter 111 is provided such that an opening portion provided on a side surface facing the center robot 15 of the processing chamber 110 is covered. When the shutter 111 is opened, the opening portion is exposed so that the substrate S can be carried in and carried out via the opening portion. In addition, when processing for the substrate S is executed inside the processing chamber 110, the shutter 111 is closed so that an atmosphere inside the processing chamber 110 is blocked from the outside.

Similarly, the substrate processing unit 12A has a processing chamber 120 and a shutter 121 that is provided on a side surface facing the center robot 15 of the processing chamber 120. In addition, the substrate processing unit 13A has a processing chamber 130 and a shutter 131 that is provided on a side surface facing the center robot 15 of the processing chamber 130. In addition, the substrate processing unit 14A has a processing chamber 140 and a shutter 141 that is provided on a side surface facing the center robot 15 of the processing chamber 140.

Further, sets of substrate processing units disposed in a horizontal direction in this manner are disposed in a plurality of stages (two stages in this example) in an up-down direction. That is, as illustrated in FIG. 1B, a substrate processing unit 11B is provided below the substrate processing unit 11A. The configuration and the function of the substrate processing unit 11B are the same as those of the substrate processing unit 11A. In addition, a substrate processing unit 12B having the same configuration and the same function as the substrate processing unit 12A is provided below the substrate processing unit 12A. Similarly, a substrate processing unit 13B (FIG. 2) is provided underneath the substrate processing unit 13A and a substrate processing unit (not illustrated) is provided underneath the substrate processing unit 14A as well. The number of stages of substrate processing units is not limited to two as exemplified herein and is arbitrary. In addition, the number of arranged substrate processing units per stage is also not limited thereto. Naturally, only one stage of substrate processing units may be adopted.

Figure 2:
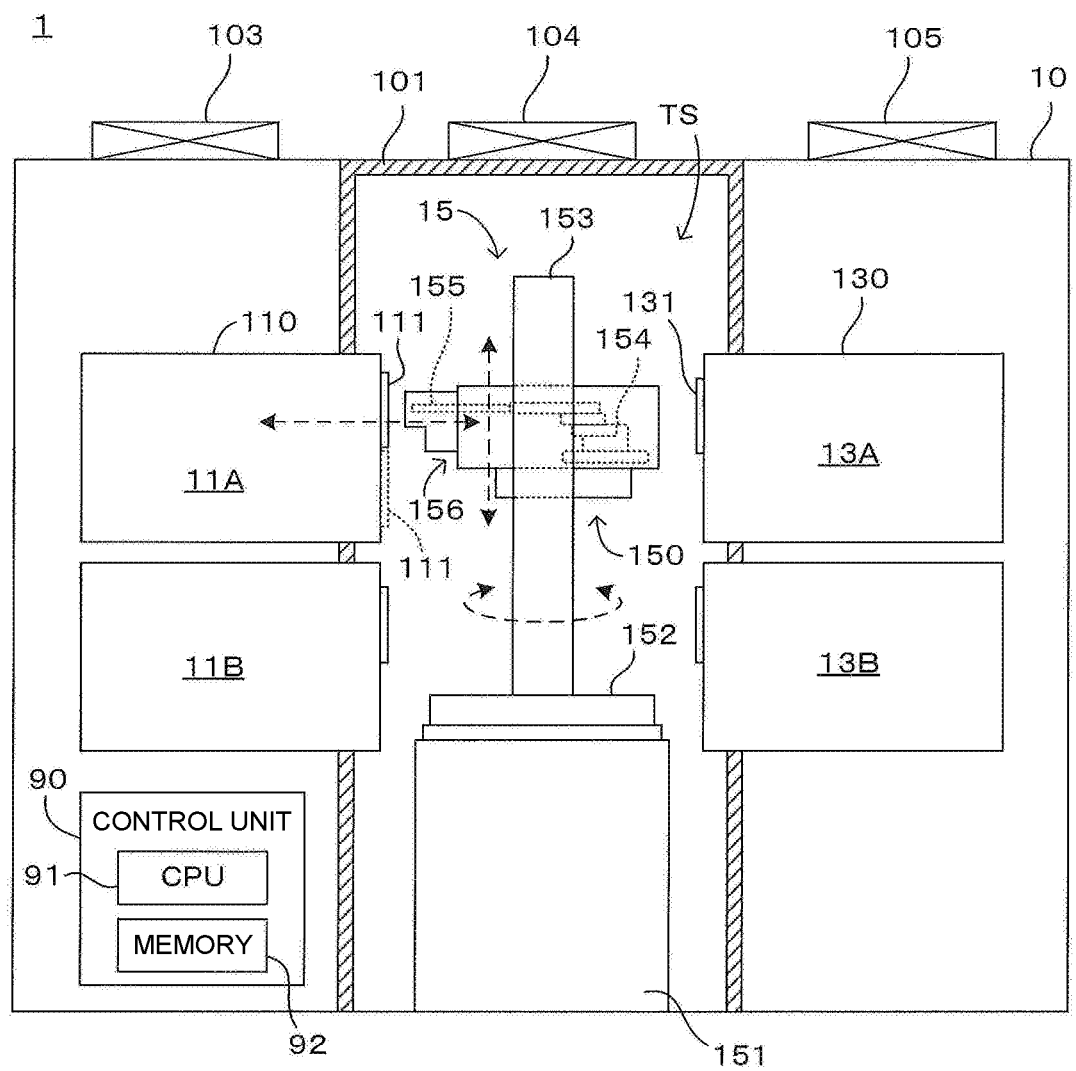
FIG. 2 is a view illustrating a configuration of a center robot and an installation environment thereof.

FIG. 2 is a view illustrating a configuration of a center robot and an installation environment thereof. The center robot 15 functions as a substrate transfer unit for transferring a substrate between chambers. Moreover, the center robot 15 can receive an unprocessed substrate S from the indexer robot 22 and can deliver a processed substrate S to the indexer robot 22. Specifically, the center robot 15 includes a pedestal portion 151, a rotation base 152, a support frame 153, a telescopic arm 154, a hand 155, and a cover portion 156.

The pedestal portion 151 is fixed to a bottom portion frame of the substrate processing section 10 and supports each of the constituents of the center robot 15. The rotation base 152 is attached to the pedestal portion 151 and can turn around the vertical axis with respect to the pedestal portion 151. The support frame 153 is a gantry-shaped frame body (which will be described below in detail) fixed to the rotation base 152 and supports a substrate holding unit 150, in which the telescopic arm 154, the hand 155, and the cover portion 156 are integrated, such that the substrate holding unit 150 can move upward and downward.

In the substrate holding unit 150, the telescopic arm 154 moves the hand 155 horizontally by turning and performing telescopic motion. The cover portion 156 accommodates the telescopic arm 154 and the hand 155 moving horizontally in this manner in an internal space thereof. The hand 155 has a structure in which the substrate S can be placed on the upper surface thereof and can be held, and the substrate S can be delivered between the hand 155 and the hand 223 of the indexer robot 22. Hand mechanisms having such a structure are known, so that detailed description thereof will be omitted.

As indicated by the dashed arrow in FIG. 2, the rotation base 152 turns around the vertical axis, and the substrate holding unit 150 moves upward and downward in the up-down direction. In addition, the hand 155 moves horizontally due to a telescopic movement of the telescopic arm 154. As described below, access of the hand 155 to each of the chambers 110 or the like is realized by a combination of operations thereof, and a substrate can be carried into each of the chambers and a substrate can be carried out from the chambers.

In the substrate processing apparatus 1 having the foregoing configuration, processing for the substrate S is executed as follows. In an initial state, an unprocessed substrate S is accommodated in the container C placed on the container holding portion 21. The indexer robot 22 takes out one unprocessed substrate S from the container C and delivers it to the center robot 15. The center robot 15 carries the received substrate S into a substrate processing unit executing the processing for the substrate S.

For example, when the substrate S is carried into the substrate processing unit 11A, as illustrated in FIG. 2, the center robot 15 adjusts the height of the substrate holding unit 150 with respect to the support frame 153. Accordingly, the substrate S held in the hand 155 is positionally set at the height of the shutter 111 on the side surface of the processing chamber 110 of the substrate processing unit 11A. When the shutter 111 is opened and the telescopic arm 154 extends toward the opening portion on the side surface of the processing chamber 110, the substrate S held in the hand 155 is carried into the processing chamber 110. After the telescopic arm 154 retreats, the shutter 111 is closed, and processing for the substrate S is executed inside the processing chamber 110. The substrate S can also be carried into a different substrate processing unit in a similar manner.

On the other hand, when the processed substrate S is taken out from the substrate processing unit 11A, the telescopic arm 154 enters the processing chamber 110, in which the shutter 111 is opened, and takes out the processed substrate S. In this manner, when the telescopic arm 154 moves the hand 155 forward and rearward with respect to the processing chamber 110 in a state in which the substrate holding unit 150 is disposed facing the processing chamber 110, access of the hand 155 to the processing chamber 110 is realized. The substrate S which has been taken out may be carried into a different substrate processing unit and new processing may be executed, or it may return to the container C via the indexer robot 22. A specific processing sequence in this embodiment will be described below in detail.

As illustrated in FIG. 2, the center robot 15 is installed in a transfer space TS of which side portions and a top portion become isolated from the outside space by a partition wall 101. The substrate processing unit 11A is attached to a side portion of the partition wall 101 while the side surface on which the shutter 111 of the processing chamber 110 is provided faces the transfer space TS. Other substrate processing units have a similar configuration as well. In addition, fan filter units (FFUs) 103, 104, and 105 for supplying clean air to the inside of the apparatus and generating a moderate downflow are provided above the substrate processing units 11A and 13A and the transfer space TS.

In addition to that described above, a control unit 90 for controlling operation of each unit of the apparatus is provided in the substrate processing apparatus 1. The control unit 90 includes at least a central processing unit (CPU) 91 and a memory 92. The CPU 91 causes each unit of the apparatus to execute predetermined operations by executing a control program which has been prepared in advance. In addition, the memory 92 stores the control program to be executed by the CPU 91, data generated by the executed program, and the like. The operation of the indexer robot 22 and the center robot 15 and the operation related to opening and closing of the shutter in each of the processing chambers, various kinds of processing for the substrate S, and the like described above are controlled by the CPU 91 executing the control program.

Figure 3A:
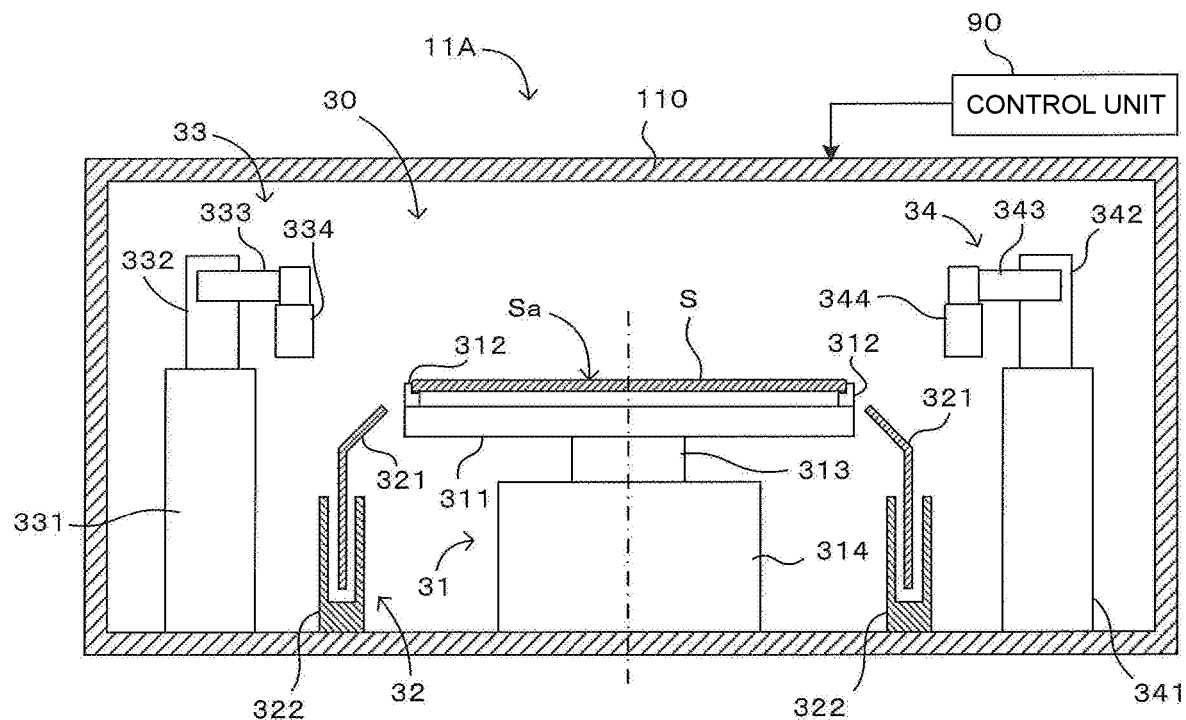
FIG. 3A is a view illustrating a configuration of a substrate processing unit executing wet processing.
Figure 3B:
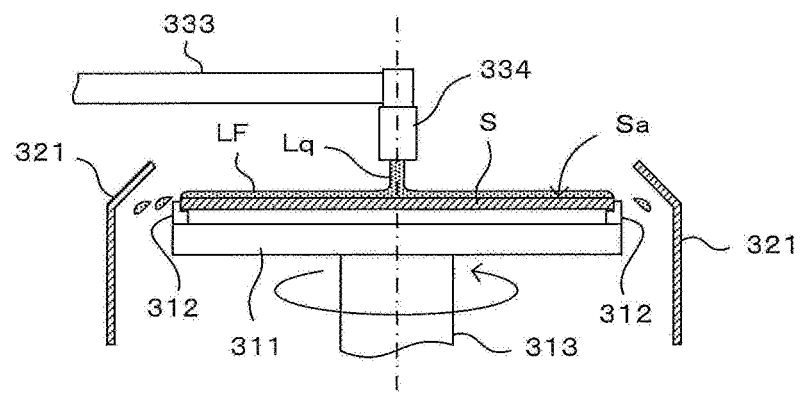
FIG. 3B is a view for describing operation of the substrate processing unit.

FIGS. 3A and 3B are views illustrating a substrate processing unit executing wet processing. More specifically, FIG. 3A is a view illustrating a configuration of the substrate processing unit 11A, and FIG. 3B is a view for describing operation of the substrate processing unit 11A. Here, a configuration of the substrate processing unit 11A will be described. However, other substrate processing units 11B, 12A, and the like executing wet processing basically have the same configuration as well.

The substrate processing unit 11A includes a wet processing unit 30 as a substrate processing main agent inside the processing chamber 110. The wet processing unit 30 performs surface processing, cleaning, or the like of the substrate S by supplying a processing liquid to an upper surface Sa of the substrate S. In addition, in order to prevent the upper surface Sa of the substrate S which is carried out after wet processing from being exposed to the ambient atmosphere, the wet processing unit 30 executes liquid film forming processing in parallel for covering the upper surface Sa of the wet-processed substrate S with a liquid film made of a low-surface tension liquid.

For this purpose, the wet processing unit 30 includes a substrate holding unit 31, a splash guard 32, a processing liquid supply unit 33, and a low-surface tension liquid supply unit 34. The control unit 90 controls operation of these units. The substrate holding unit 31 has a disk-shaped spin chuck 311 having a diameter substantially equivalent to that of the substrate S, and a plurality of chuck pins 312 are provided in a circumferential edge portion of the spin chuck 311. Due to the chuck pins 312 abutting the circumferential edge portion of the substrate S and supporting the substrate S, the spin chuck 311 can hold the substrate S in a horizontal posture in a state of being separated from the upper surface thereof.

The spin chuck 311 is supported such that the upper surface is maintained horizontally by a rotation pivot 313 extending downward from a central portion on a lower surface thereof. The rotation pivot 313 is rotatably supported by a rotation mechanism 314 attached to a bottom portion of the processing chamber 110. A rotary motor (not illustrated) is built into the rotation mechanism 314. When the rotary motor rotates in response to a control command from the control unit 90, the spin chuck 311 which is directly joined to the rotation pivot 313 rotates around the vertical axis as indicated by the one-dot dashed line. In FIGS. 3A and 3B, the up-down direction is a vertical direction. Accordingly, the substrate S is rotated around the vertical axis while remaining in a horizontal posture.

The splash guard 32 is provided such that the substrate holding unit 31 is surrounded from the side. The splash guard 32 has a substantially tubular cup 321 that is provided such that the circumferential edge portion of the spin chuck 311 is covered, and a liquid receiving portion 322 that is provided below an outer circumferential portion of the cup 321. The cup 321 moves upward and downward in response to a control command from the control unit 90. The cup 321 moves upward and downward between the lower position illustrated in FIG. 3A and an upper position illustrated in FIG. 3B. The lower position is a position of the cup 321 at the time when an upper end portion of the cup 321 has moved down below the circumferential edge portion of the substrate S held by the spin chuck 311. In addition, the upper position is a position of the cup 321 at the time when the upper end portion of the cup 321 is at a position above the circumferential edge portion of the substrate S.

When the cup 321 is at the lower position, as illustrated in FIG. 3A, the substrate S held by the spin chuck 311 is in a state of being exposed to the outside of the cup 321. For this reason, for example, the cup 321 is prevented from becoming an obstacle when the substrate S is carried into and carried out from the spin chuck 311.

In addition, when the cup 321 is at the upper position, as illustrated in FIG. 3B, the cup 321 surrounds the circumferential edge portion of the substrate S held by the spin chuck 311. Accordingly, a processing liquid shaken from the circumferential edge portion of the substrate S at the time of supplying a liquid (which will be described below) is prevented from scattering inside the chamber 110, and thus the processing liquid can be reliably retrieved. That is, when the substrate S rotates, droplets of a processing liquid shaken from the circumferential edge portion of the substrate S adhere to an inner wall of the cup 321, flow downward, and are gathered and retrieved by the liquid receiving portion 322 disposed below the cup 321. In order to individually retrieve a plurality of processing liquids, cups may be provided concentrically in a plurality of stages.

The processing liquid supply unit 33 has a structure in which a nozzle 334 is attached to a tip of an arm 333 extending horizontally from a turning pivot 332 which is provided such that it can turn with respect to a base 331 fixed to the processing chamber 110. The arm 333 oscillates when the turning pivot 332 turns in response to a control command from the control unit 90. Accordingly, the nozzle 334 at the tip of the arm 333 moves between a retreat position at which it has retreated to the side from above the substrate S as illustrated in FIG. 3A and a processing position above the substrate S illustrated in FIG. 3B.

The nozzle 334 is connected to a processing liquid supply unit (not illustrated) provided in the control unit 90. When a suitable processing liquid is sent out from the processing liquid supply unit, the processing liquid is discharged from the nozzle 334 toward the substrate S. As illustrated in FIG. 3B, due to the spin chuck 311 rotating at a relatively low speed, a processing liquid Lq is supplied from the nozzle 334 positionally set above a rotation center of the substrate S while the substrate S is rotated. Consequently, the upper surface Sa of the substrate S is processed using the processing liquid Lq. Regarding the processing liquid Lq, a liquid having various kinds of functions, such as a developing solution, an etching solution, a cleaning solution, or a rinse solution can be used, and the composition thereof is arbitrary. In addition, processing may be executed using a combination of a plurality of kinds of processing liquids.

The low-surface tension liquid supply unit 34 also has a configuration corresponding to the processing liquid supply unit 33. That is, the low-surface tension liquid supply unit 34 has a base 341, a turning pivot 342, an arm 343, a nozzle 344, and the like. The configurations of these elements are equivalent to those of corresponding elements in the processing liquid supply unit 33. When the turning pivot 342 turns in response to a control command from the control unit 90, the arm 343 oscillates. The nozzle 344 at the tip of the arm 343 supplies a low-surface tension liquid for forming a liquid film to the upper surface Sa of the wet-processed substrate S.

Operation of the low-surface tension liquid supply unit 34 can be described by rewording "the processing liquid Lq", "the arm 333", and "the nozzle 334" in the foregoing description of FIG. 3B as "the low-surface tension liquid Lq", "the arm 343", and "the nozzle 344", respectively. However, a liquid to be discharged is a low-surface tension liquid and is a liquid of a different kind from a general processing liquid.

When a fine uneven pattern (which will hereinafter be simply referred to as "a pattern") is formed on the upper surface Sa of a substrate which becomes a processing target, there is concern that pattern collapse may occur due to the surface tension of a liquid which has entered the pattern during a process of drying a wet substrate S which has been wet-processed. Examples of a method for preventing this include a method in which a liquid having a lower surface tension replaces a liquid inside a pattern and is dried, a sublimation drying method in which the upper surface Sa of a substrate is covered with a solid sublimable substance and the sublimable substance is sublimated, and a supercritical drying method employed in the present embodiment.

In order to perform supercritical drying processing requiring a state of a high temperature and a high pressure, it is necessary to provide a high-pressure chamber separately from the chamber for performing wet processing. For this reason, there is a need to transfer the wet-processed substrate S to the high-pressure chamber. In order to avoid collapse caused by exposure of the pattern during transfer, it is desirable that the upper surface Sa of a substrate be covered with a liquid or a solid. From the viewpoint of more reliably preventing pattern collapse caused by a surface tension, it is desirable that a liquid for covering the upper surface Sa of a substrate at this time be a liquid having a lower surface tension than that of a processing liquid. In this specification, a liquid having such properties will be referred to as "a low-surface tension liquid".

In this embodiment, the transfer is performed in a state in which the upper surface Sa of a substrate is covered with a liquid film of a low-surface tension liquid. A liquid film is formed as follows. When the low-surface tension liquid Lq supplied from a low-surface tension liquid supply source (not illustrated) provided in the control unit 90 is discharged from the nozzle 344 in a state in which the substrate S is rotated at a predetermined rotation speed, the upper surface Sa of a substrate is in a state of being covered with a liquid film LF made of a low-surface tension liquid. Regarding a low-surface tension liquid, it is desirable to use a liquid which has favorable miscibility with a processing liquid used in wet processing and having a lower surface tension than that of the processing liquid. For example, when a processing liquid has water as a main component, isopropyl alcohol (IPA) can be suitably utilized. In this manner, the entire upper surface Sa of a substrate is in a state of being covered with the liquid film LF made of a low-surface tension liquid.

The substrate S carried out from the substrate processing unit 11A in a state in which the upper surface Sa is covered with the liquid film LF is transferred to the substrate processing unit 13A and is subjected to dry processing. That is, the substrate processing unit 13A has a function of executing dry processing as substrate processing, in which the liquid film LF formed on the upper surface Sa of the substrate S carried thereinto in a horizontal posture is removed and the substrate S is dried. Regarding dry processing, supercritical drying processing in which the substrate S is covered with a supercritical fluid and the supercritical fluid is gasified and removed (without going through a liquid phase) is applied. Here, a configuration of the substrate processing unit 13A will be described. However, other substrate processing units 13B, 14A, and the like executing dry processing basically have the same configuration as well.

Figure 4:
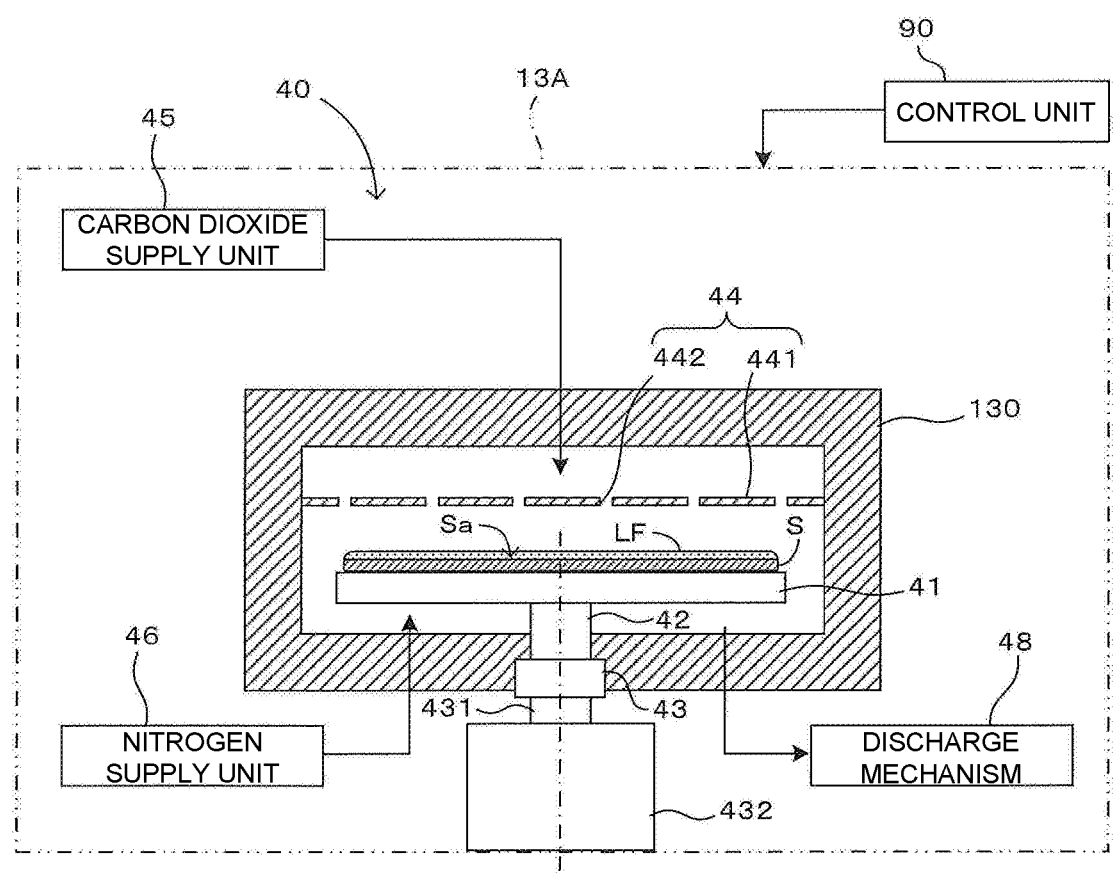
FIG. 4 is a view illustrating a substrate processing unit executing supercritical drying processing.

FIG. 4 is a view illustrating a substrate processing unit executing supercritical drying processing. More specifically, FIG. 4 is a cross-sectional side view illustrating an internal structure of the substrate processing unit 13A. The principle of supercritical drying processing and a basic configuration required therefor are known, so that detailed description thereof will be omitted herein. The substrate processing unit 13A includes a high-pressure chamber 130 and a dry processing unit 40 serving as a main agent for executing dry processing. In the dry processing unit 40, a stage 41 for placing the substrate S thereon is installed inside the high-pressure chamber 130. The stage 41 holds the substrate S of which the upper surface Sa is covered with a liquid film through adsorption holding or mechanical holding. Since the high-pressure chamber 130 is under a high pressure, the internal configuration is relatively simple in order to withstand a high pressure, and a member which can withstand a high pressure is used.

A rotation pivot 42 extends downward at the center on the lower surface of the stage 41. The rotation pivot 42 is inserted through a bottom surface of the high-pressure chamber 130 via a high-pressure seal rotation introduction mechanism 43. A rotation shaft 431 of the high-pressure seal rotation introduction mechanism 43 is connected to a rotation mechanism 432. For this reason, when the rotation mechanism 432 operates in response to a control command from the control unit 90, the substrate S rotates together with the stage 41 around the rotation shaft in the vertical direction indicated by the one-dot dashed line.

A fluid distribution member 44 is provided above the stage 41 inside the high-pressure chamber 130. A plurality of penetration holes 442 vertically penetrating a flat blocking plate 441 are provided in the fluid distribution member 44. As necessary, carbon dioxide gas is supplied to an upper portion of the high-pressure chamber 130 from a carbon dioxide supply unit 45, and the carbon dioxide gas is rectified by the fluid distribution member 44 and is uniformly supplied toward the substrate S from above the substrate S.

In addition, as necessary, nitrogen is introduced into the high-pressure chamber 130 from a nitrogen supply unit 46. Nitrogen is supplied in accordance with the purpose of purging the inside of the high-pressure chamber 130 with gas or cooling the inside of the chamber in various kinds of forms as necessary, that is, as gas at a normal temperature, as warmed gas, and as liquid nitrogen which has been cooled and liquefied.

Moreover, a discharge mechanism 48 is connected to the high-pressure chamber 130. The discharge mechanism 48 has a function of discharging various kinds of fluids, as necessary, such as a gas or a liquid introduced into the high-pressure chamber 130. The discharge mechanism 48 includes a piping, a valve, a pump, and the like for this. Accordingly, a fluid inside the high-pressure chamber 130 can be discharged promptly when necessary.

Although illustration thereof is omitted, the control unit 90 has a configuration for detecting the pressure or the temperature inside the high-pressure chamber 130 and a configuration for controlling the pressure and the temperature such that they have predetermined values. That is, the control unit 90 has a function of controlling the pressure and the temperature inside the high-pressure chamber 130 such that they have predetermined target values.

Next, a structure of the center robot 15 will be described. The center robot 15 plays a role of delivering the substrate S with respect to the indexer robot 22 and transferring the substrate S between the chambers. Among these, the substrate S is transferred from the wet processing unit 11A or the like to the dry processing unit 13A or the like in a state in which the liquid film LF made of a low-surface tension liquid is formed on the upper surface Sa of the substrate S in a horizontal posture. The liquid film LF is formed to prevent exposure of a surface of the substrate S and occurrence of pattern collapse when the substrate S is transferred from the wet processing unit 11A or the like to the dry processing unit 13A or the like. However, a liquid may fall from the substrate S or may evaporate from the surface of the substrate S during a transfer process.

When the liquid scatters from the substrate S in this manner, the inside of the apparatus becomes contaminated. Particularly, when a liquid is corrosive or flammable, it is necessary for the apparatus to have countermeasures for such properties, so that the apparatus is increased in size, which also leads to increase in costs. Therefore, in this embodiment, as described below, scattering of a liquid is prevented by covering a surrounding area of the hand 155 holding the substrate S on which the liquid film LF is formed with a cover.

Figure 5:
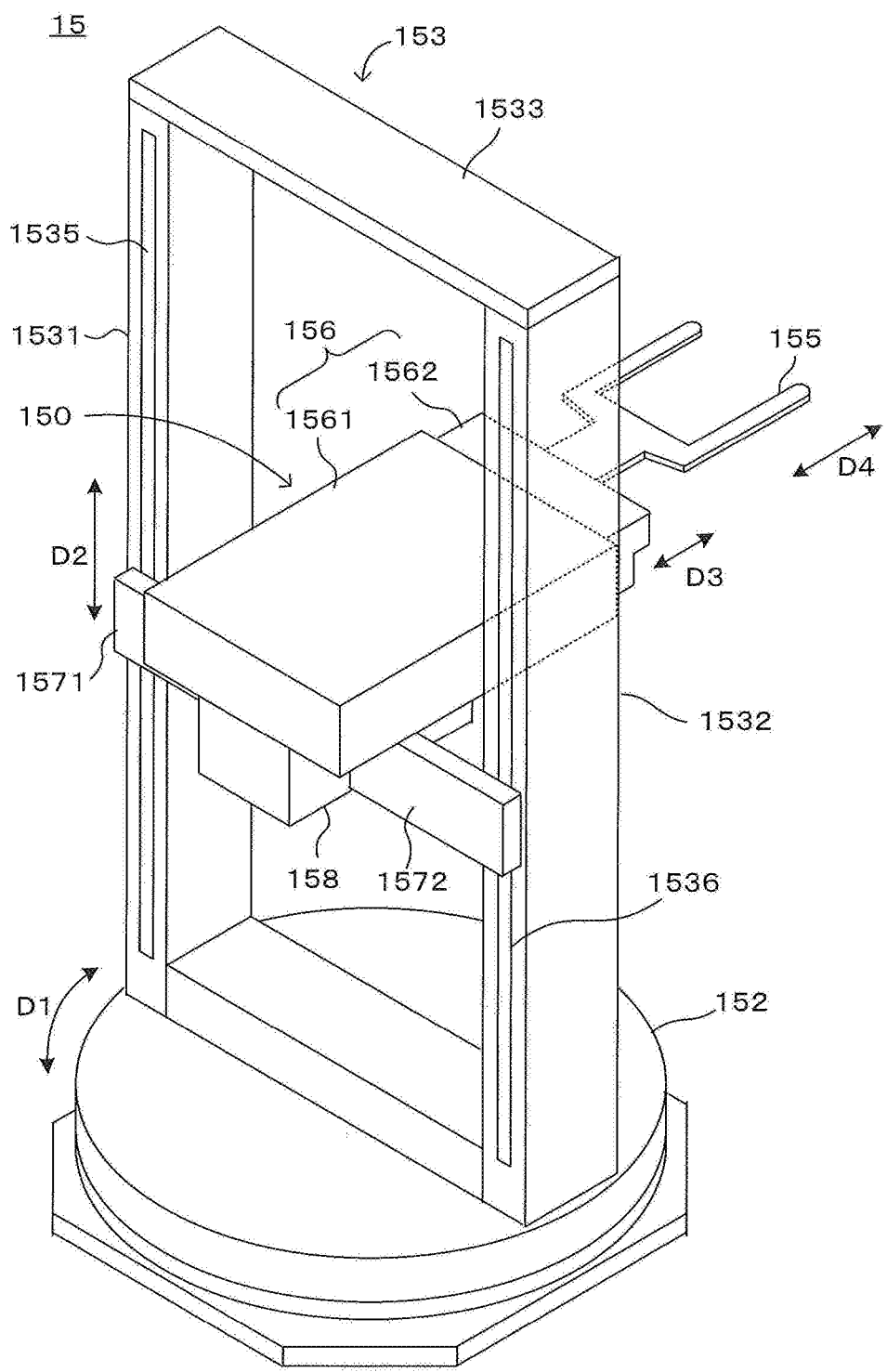
FIG. 5 is a perspective view illustrating the appearance of the center robot.

FIG. 5 is a perspective view illustrating the appearance of the center robot. In the center robot 15, the rotation base 152 is attached to the pedestal portion 151 (FIG. 2) via a suitable rotation mechanism such as a motor. When the rotation mechanism operates in response to a control command from the control unit 90, the rotation base 152 turns around the vertical axis. The substrate holding unit 150 is attached to the support frame 153 extending upward from this rotation base 152. More specifically, two struts 1531 and 1532 are attached to the upper surface of the rotation base 152 having substantially a disk shape. Upper end portions of these struts are joined to each other by a beam member 1533, thereby configuring the gantry-type support frame 153 in its entirety. Guide rails 1535 and 1536 are respectively provided on side surfaces of the struts 1531 and 1532, and the substrate holding unit 150 is mounted therein.

More specifically, support arms 1571 and 1572 extending in the horizontal direction are fixed to a lower portion of the cover portion 156 of the substrate holding unit 150. Sliders (not illustrated) provided at tips of the support arms 1571 and 1572 are engaged with the guide rails 1535 and 1536 such that the sliders can move upward and downward. A suitable upward/downward movement mechanism, such as a ball screw mechanism, a linear motor, or a direct-acting guide, is embedded in each of the struts 1531 and 1532. When the upward/downward movement mechanism operates in response to a control command from the control unit 90, the entire substrate holding unit 150 moves upward and downward along the guide rails 1535 and 1536. Due to this operation of upward and downward movement, the position of the substrate holding unit 150 in a height direction is determined.

The position of the substrate holding unit 150 is determined on the basis of a combination of a rotation angle of the rotation base 152 determined by operation of the rotation mechanism and the position of the substrate holding unit 150 in the height direction determined by operation of the upward/downward movement mechanism. In this manner, for example, the substrate holding unit 150 can be positionally set at a position facing one substrate processing unit. In FIG. 5, the arrow D1 indicates a rotation direction of the rotation base 152 in operation of the rotation mechanism, and the arrow D2 indicates a moving direction of the substrate holding unit 150 in operation of the upward/downward movement mechanism, respectively.

The substrate holding unit 150 has a structure in which the cover portion 156 covers a surrounding area of the telescopic arm 154 and the hand 155 which access the inside of the chamber of each of the substrate processing units and carry in or carry out the substrate S. As described next, the cover portion 156 has a double-cylinder structure which can perform a telescopic movement in the horizontal direction and realizes operation of carrying in and carrying out of a substrate with respect to the chamber by performing a telescopic movement in association with a horizontal movement of the hand 155. In FIG. 5, the arrow D3 indicates a telescopic movement direction of the cover portion 156 (which will be described below), and the arrow D4 indicates a forward/rearward movement direction of the hand 155, respectively.

Hereinafter, operation at the time when the substrate holding unit 150 accesses the chamber 110 of one substrate processing unit 11A and carries in or carries out a substrate will be described as an example. However, it is conceivable that the same be able to apply to access to other chambers.

Figure 6A:
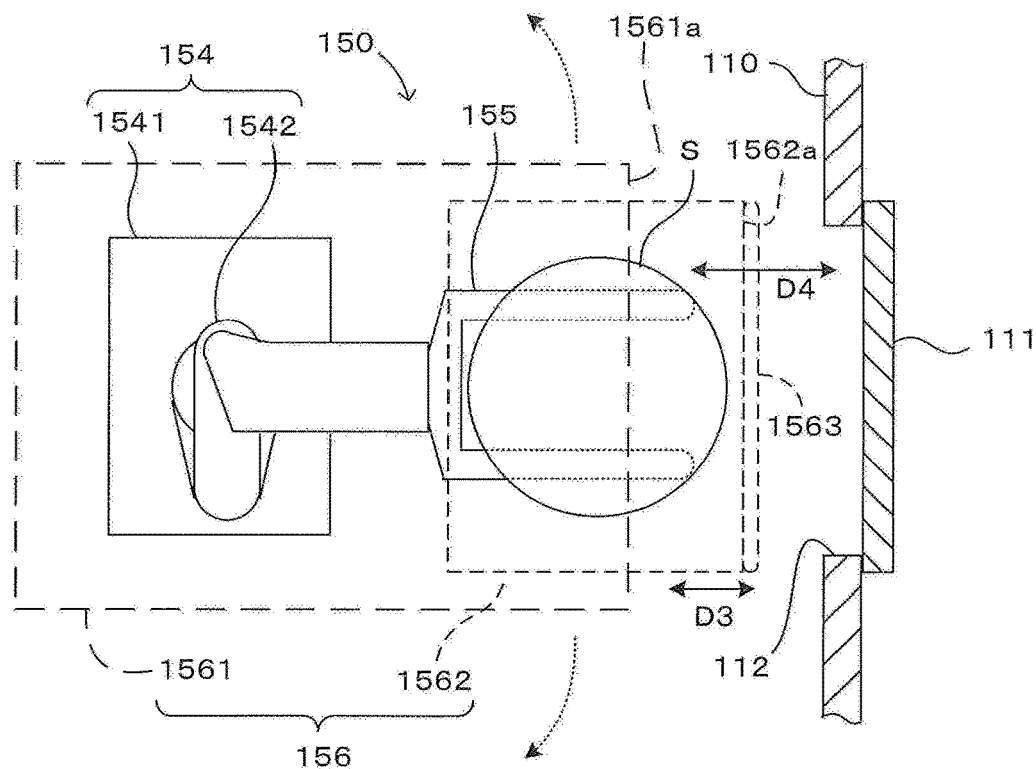
FIG. 6A is a plan view illustrating a state before a hand accesses a chamber.
Figure 6B:
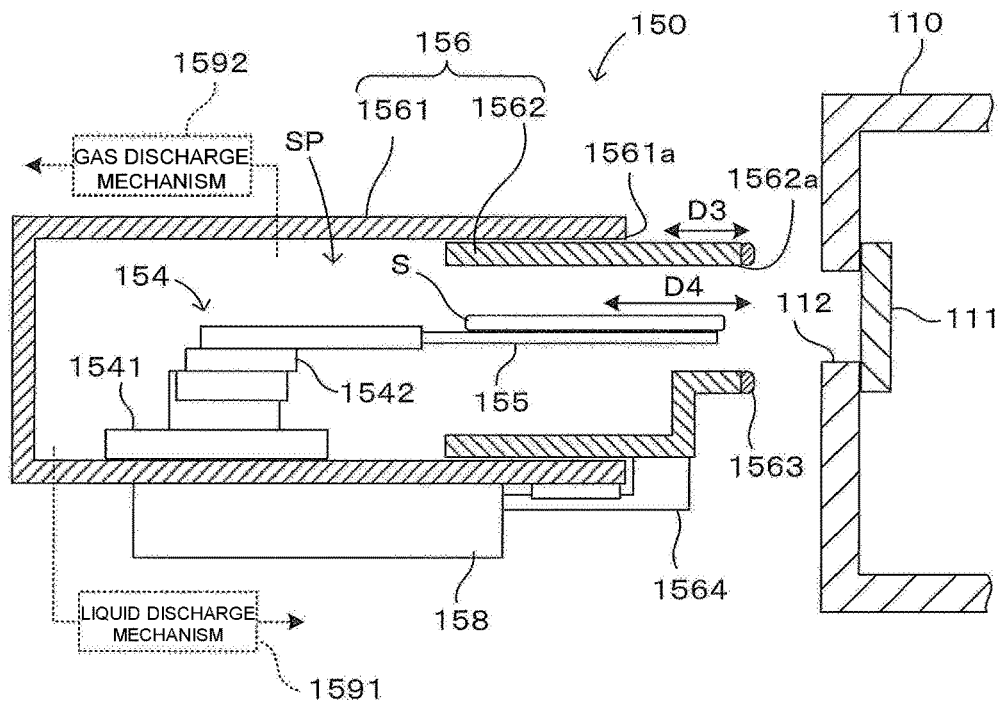
FIG. 6B is a cross-sectional side view illustrating a state before the hand accesses the chamber.
Figure 7A:
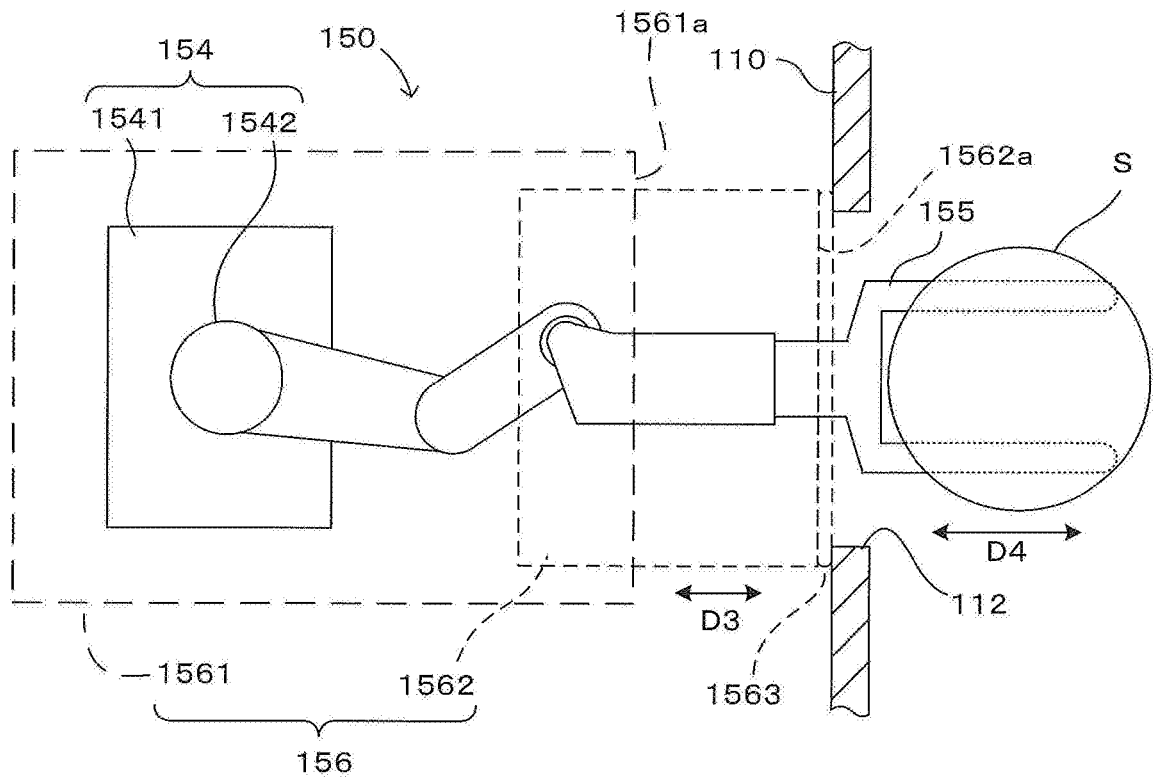
FIG. 7A is a plan view illustrating a state in which the hand has entered the chamber.
Figure 7B:
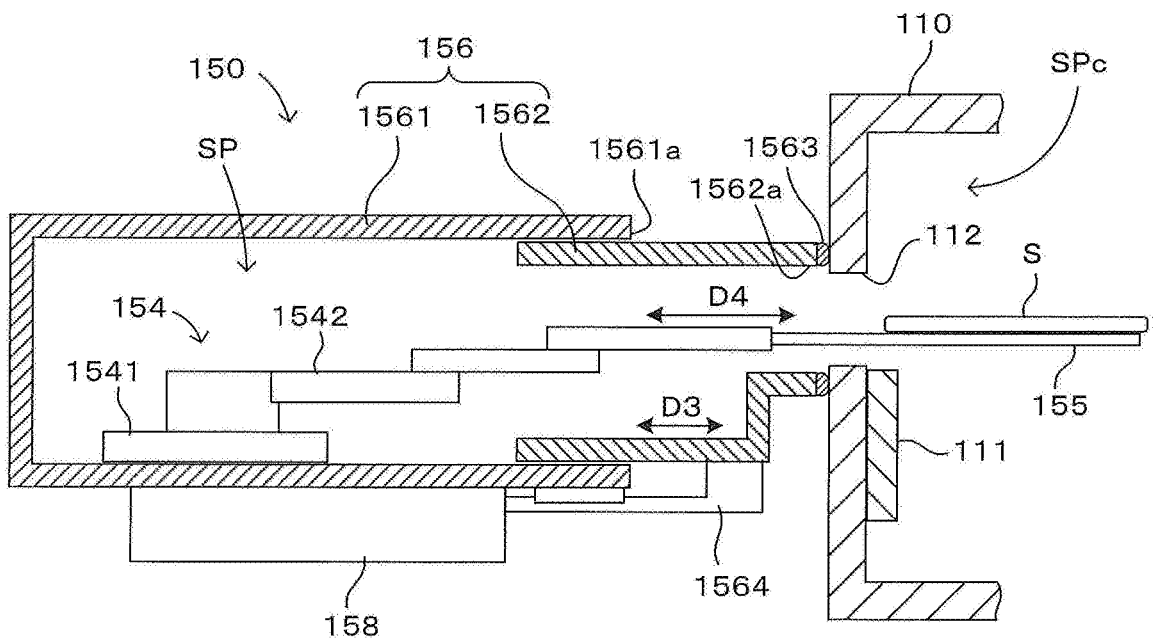
FIG. 7B is a cross-sectional side view illustrating a state in which the hand has entered the chamber.

FIGS. 6A to 7B are views schematically illustrating operation of the substrate holding unit at the time of access to the chamber. More specifically, FIG. 6A is a plan view illustrating a state before the hand 155 accesses the chamber 110, and FIG. 6B is a cross-sectional side view of the same. In addition, FIG. 7A is a plan view illustrating a state in which the hand 155 has entered the chamber 110, and FIG. 7B is a cross-sectional side view of the same.

As illustrated in these diagrams, the telescopic arm 154 has an articulated arm 1542 that is attached to a base portion 1541, and the hand 155 that is formed to have a forked shape to be able to hold the substrate S is attached to a tip of the articulated arm 1542. When joints of the telescopic arm 154 turn in cooperation with each other, the form of the telescopic arm 154 changes between a folded state illustrated in FIG. 6A and an extended state illustrated in FIG. 7A. Accordingly, the hand 155 mounted at the tip of the arm moves horizontally, thereby moving forward and rearward along the direction of the arrow D4 as the forward/rearward movement direction.

As illustrated in FIG. 7A, in a state in which the substrate holding unit 150 is positionally set at a position facing the chamber 110 (more specifically, an opening portion 112 thereof) and the telescopic arm 154 is extended, the hand 155 is in a state in which it has entered the chamber 110 via the opening portion 112 of the chamber 110. Accordingly, the substrate S can be carried into the chamber 110 and the substrate S can be carried out from the chamber 110. The position of the hand 155 at this time will be referred to as "an internal position". On the other hand, in a state in which the telescopic arm 154 is folded as illustrated in FIG. 6A, the hand 155 is in a state in which it has retreated to the outside of the chamber 110. The position of the hand 155 at this time will be referred to as "an external position".

The cover portion 156 is provided such that the telescopic arm 154 and the hand 155 operating in this manner are covered. The cover portion 156 includes a cover main body 1561 and an extending member 1562. The cover main body 1561 is formed to have a box shape including a movable range of the telescopic arm 154 within the internal space. The extending member 1562 is formed to have a tubular hollow structure in which an opening is provided at both ends and penetrates the extending member 1562 in the horizontal direction and is engaged with the cover main body 1561. An opening 1562a, of two openings in the extending member 1562, on a side exposed to the outside (that is, on a side opposite to an opening on the cover main body 1561 side) serves as a doorway when the hand 155 holding the substrate S moves forward from an internal space SP of the cover portion 156 to the outside space (in this example, the transfer space TS).

More specifically, the cover main body 1561 has a box shape in which an opening 1561a is provided on a side surface corresponding to a forward/rearward movement path of the hand 155. The telescopic arm 154 is accommodated in the internal space SP of the cover main body 1561, and a driving mechanism 158 for operating the telescopic arm 154 is attached to a lower portion of the cover main body 1561. The driving mechanism 158 operates a movable portion of the substrate holding unit 150 in response to a control command from the control unit 90. Regarding at least the bottom surface of the cover main body 1561, it is desirable that an opening portion communicating with the outside space (transfer space TS) be not provided and a gradient for inducing a liquid in a direction of the opening 1561a be not provided in order to temporarily store a liquid which has spilt from the substrate S.

The extending member 1562 has a tubular hollow structure in which both side surfaces corresponding to the forward/rearward movement direction D4 of the hand 155 are open, that is, which is penetrated in the horizontal direction. The extending member 1562 is formed to have external dimensions slightly smaller than the opening 1561a of the cover main body 1561, and the cover portion 156 has a double-cylinder structure due to a part of the extending member 1562 which has entered the opening 1561a. Contrary to that described above, the extending member 1562 may have a structure surrounding the opening 1561a of the cover main body 1561 from the outward side. A forward/rearward movement rod 1564 is coupled to the extending member 1562, and the forward/rearward movement rod 1564 is driven by the driving mechanism 158 in the horizontal direction along the forward/rearward movement direction D4 of the hand 155. Accordingly, the extending member 1562 is movable in the horizontal direction with respect to the cover main body 1561. In the present embodiment, the moving direction D3 thereof is substantially the same direction as the forward/rearward movement direction D4 of the hand 155.

Due to such a mechanism, the cover portion 156 in its entirety has a structure for performing a telescopic movement within a predetermined range in the direction D3. That is, the form of the cover portion 156 changes between a state in which the extending member 1562 has been drawn into the cover main body 1561 and has moved rearward from the chamber 110 as illustrated in FIGS. 6A and 6B and a state in which the extending member 1562 has been drawn out further to the outside and has moved forward to the chamber 110 side as illustrated in FIGS. 7A and 7B. Hereinafter, the position of the extending member 1562 illustrated in FIGS. 6A and 6B will be referred to as "a rearward movement position", and the position of the extending member 1562 illustrated in FIGS. 7A and 7B will be referred to as "a forward movement position".

In a state in which the telescopic arm 154 is folded as illustrated in FIGS. 6A and 6B, the extending member 1562 is positionally set in a direction in which the extending member 1562 enters the cover main body 1561 deepest (left side in the diagrams). At this time, the sizes of the cover main body 1561 and the extending member 1562 are set such that the telescopic arm 154, the hand 155, and the substrate S held by the hand 155 are entirely accommodated inside the internal space SP formed by the cover main body 1561 and the extending member 1562 coupled to each other. In FIGS. 6A and 7A, in order to clearly illustrate the internal structure, the cover main body 1561 and the extending member 1562 are expressed using dotted lines of two kinds.

The operation of the substrate holding unit 150 in a process of transferring the substrate S using the center robot 15 may include a turning operation conducted by the rotation mechanism and an operation of upward and downward movement conducted by the upward/downward movement mechanism. When a liquid film is formed on the upper surface of the substrate S during the foregoing operation, there is concern that a liquid may fall from the substrate S due to vibration, acceleration, or deceleration. Even if a liquid falls, a scattering range thereof can be retained inside the cover portion 156 by accommodating the substrate S inside the internal space SP formed by the cover main body 1561 and the extending member 1562.

As illustrated in FIG. 6B, at least one of a liquid discharge mechanism 1591 and a gas discharge mechanism 1592 may be connected to the cover portion 156. Although illustration of a specific structure is omitted, a liquid which has fallen into the internal space SP of the cover portion 156 can be discharged to the outside via a suitable discharge path by the liquid discharge mechanism 1591. In addition, in order to prevent vapor generated through evaporation of a liquid from leaking out to the outside, the gas discharge mechanism 1592 may apply a slight negative pressure to the internal space SP.

In addition, there are cases in which a liquid evaporates from the substrate S, but progress of evaporation can be curbed due to vapor filling the internal space SP. In this manner, the cover portion 156 has an effect of curbing scattering of a liquid which has fallen from the substrate S and evaporation of a liquid from the substrate S. In order to further enhance this effect, a step is provided on a lower surface of the extending member 1562, and an opening area of the opening 1562a exposed to the transfer space TS (FIG. 2) is narrowed. Accordingly, a probability of leakage of a liquid to the outside via the opening 1562a can be reduced.

Regarding the opening 1562a, in order to further enhance the foregoing effect, for example, a slit-shaped opening having a necessary minimum opening size for allowing the hand 155 and the substrate S to pass through may be adopted, or a shutter member for opening and closing an opening may be provided.

As illustrated in FIG. 6A, when the extending member 1562 is drawn to the cover main body 1561 side and is at the rearward movement position, a tip of the extending member 1562 is in a state of being separated from a side wall surface of the chamber 110 by a predetermined distance. For this reason, as indicated by the dotted arrow, interference between the cover portion 156 and the chamber 110 is avoided when the substrate holding unit 150 turns. That is, in the center robot 15, the substrate holding unit 150 can be turned without causing interference with a chamber wall surface by positionally setting the extending member 1562 at the rearward movement position. Accordingly, the substrate holding unit 150 can be turned in various directions and can be positionally set at a position facing an arbitrary chamber.

On the other hand, as illustrated in FIG. 7A, when the extending member 1562 is at the forward movement position drawn out from the cover main body 1561, the tip portion of the extending member 1562 abuts the side wall surface of the chamber 110. Accordingly, the internal space SP of the cover portion 156 and an internal space SPc of the chamber 110 communicate with each other. Further, the hand 155 moves forward and rearward in the spaces communicating each other in this manner. Ultimately, the hand 155 further moves forward into the chamber beyond the tip portion of the extending member 1562 and is exposed to the internal space SPc of the chamber 110. Accordingly, the substrate S can be delivered inside the chamber.

When the telescopic arm 154 is extended in a state in which the extending member 1562 is at the rearward movement position, the substrate S held in the hand 155 is temporarily exposed to the outside space (transfer space TS in FIG. 2). For this reason, there may be a problem that a liquid which has fallen from the substrate S leaks out to the transfer space TS during transfer or evaporation of a liquid from the substrate S is promoted. In the present embodiment, it is possible to avoid such a problem in advance by connecting the internal spaces of the cover portion 156 and the chamber 110 to each other and causing the telescopic arm 154 to perform a telescopic movement through a movement of the extending member 1562.

In order to enhance an effect of blocking the space, it is desirable that the opening shape of the opening 1562a of the extending member 1562 correspond to the opening shape of the opening portion 112 of the chamber 110. That is, in a state in which the tip portion of the extending member 1562 abuts the chamber 110, it is desirable that the opening 1562a of the extending member 1562 and the opening portion 112 of the chamber 110 substantially coincide with each other. In this embodiment, the shapes and the sizes of both openings are substantially the same as each other, and the tip portion of the extending member 1562 facing the chamber 110 has a shape suitable for a side wall of the chamber 110. In order to further enhance the airtightness, a seal member 1563 is attached thereto such that a surrounding area of the opening 1562a of the extending member 1562 is surrounded. The seal member may be provided on the chamber 110 side. In this case, the seal member may be shared with a seal member which is provided to enhance the airtightness of the shutter 111 in the chamber 110.

The airtightness required for coupling between the cover portion 156 and the chamber 110 need only be able to curb leakage or evaporation of a liquid to a necessary and sufficient extent. Therefore, there may be a gap between members to a certain extent. On the contrary, embedding a more complicated mechanism in order to ensure the airtightness is not necessarily advantageous in regard to the purpose of transferring the substrate S in processing in a short period of time.

Next, operation of the substrate processing apparatus 1 having the foregoing configuration will be described. As described above, this substrate processing apparatus 1 is an apparatus sequentially executing wet processing and dry processing for the substrate S. A main flow of this processing is as follows. That is, a substrate S is transferred to a substrate processing unit for executing wet processing, and the processing is performed using a processing liquid. Thereafter, a liquid film is formed using a low-surface tension liquid. Further, this substrate S is transferred to a substrate processing unit for executing dry processing, and the substrate S is dried by removing the liquid film. Hereinafter, specific steps of the processing will be described.

Here, description will be given on the assumption that the substrate processing unit 11A executes wet processing for one substrate S and the substrate processing unit 13A executes dry processing. However, a combination of a substrate processing unit for executing wet processing and a substrate processing unit for executing dry processing is not limited thereto and is arbitrary. In addition, in the following description, in order to clearly illustrate the role of each of the substrate processing units, the substrate processing unit 11A or the like for executing wet processing may be referred to as "a wet processing unit" and the substrate processing unit 13A or the like for executing dry processing may be referred to as "a dry processing unit".

Figure 8:
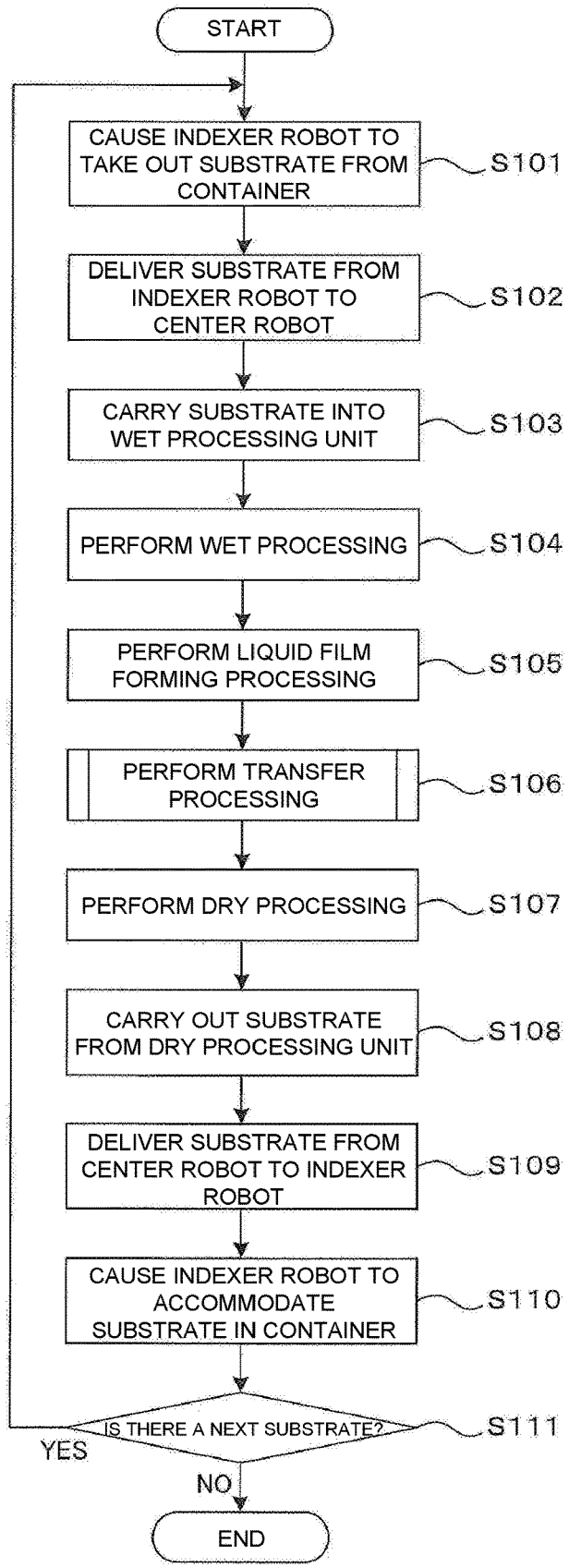
FIG. 8 is a flowchart showing operation of this substrate processing apparatus.

FIG. 8 is a flowchart showing operation of this substrate processing apparatus. This operation is realized when the CPU 91 executes a control program prepared in advance and causes each unit of the apparatus to perform predetermined operations. First, the indexer robot 22 takes out one unprocessed substrate S from one of the containers C accommodating unprocessed substrates (Step S101). Further, the substrate S is delivered from the indexer robot 22 to the center robot 15 (Step S102), and the center robot 15 carries the substrate S into the substrate processing unit (wet processing unit) 11A for executing wet processing (Step S103).

The substrate processing unit 11A into which the substrate S is carried executes wet processing for the substrate S (Step S104). Regarding steps of wet processing, as described above, a processing liquid is supplied to the substrate S, and machining or cleaning is performed for the upper surface Sa of a substrate. Liquid film forming processing for forming the liquid film LF using a low-surface tension liquid is executed for the wet-processed substrate S (Step S105).

The substrate S in which the liquid film LF is formed on the upper surface Sa through liquid film forming processing is taken out from the substrate processing unit 11A by the center robot 15 and is carried into the substrate processing unit (dry processing unit) 13A for executing dry processing. That is, transfer processing in which the substrate S is transferred from the substrate processing unit 11A to the substrate processing unit 13A is performed (Step S106). The transfer processing includes a step of carrying out the substrate S from the wet processing unit 11A and a step of carrying the substrate S into the dry processing unit 13A. Steps of the processing will be described below in detail.

The substrate processing unit 13A into which the substrate S is carried executes dry processing for the substrate S, in which an adhered liquid is removed and the substrate S is dried (Step S107). In the substrate processing unit 13A, supercritical drying processing using a supercritical fluid is executed. That is, carbon dioxide is introduced into the high-pressure chamber 130 from the carbon dioxide supply unit 45 and the internal pressure of the chamber is sufficiently increased, so that the carbon dioxide is liquefied. Alternatively, liquid carbon dioxide may be introduced into the high-pressure chamber 130. Liquid carbon dioxide covers the upper surface Sa of a substrate. Liquefied carbon dioxide dissolves organic solvents well. Therefore, a solvent such as IPA remaining inside the pattern is replaced by liquid carbon dioxide.

Subsequently, the temperature and the pressure inside the high-pressure chamber 130 are adjusted such that a condition in which carbon dioxide is in a supercritical state is brought about. Accordingly, carbon dioxide inside the high-pressure chamber 130 becomes a supercritical fluid. A fluid in a supercritical state has extremely high fluidity and a small surface tension. Particularly, a supercritical fluid generated from carbon dioxide dissolves organic solvents such as IPA and acetone well. For this reason, a supercritical fluid such as carbon dioxide enters a fine pattern deep inside and carries a remaining organic solvent component away from the inside of the pattern. A supercritical state realized at a relatively low pressure and a relatively low temperature is one of the reasons that carbon dioxide is suitable for supercritical drying processing.

Further, when the pressure inside the high-pressure chamber 130 is reduced quickly, a supercritical fluid is directly gasified and is removed from the substrate S without going through a liquid phase. Accordingly, a liquid component in the substrate S is completely removed and the substrate S is brought into a dried state. The liquid component remaining inside the pattern is replaced by the supercritical fluid, and the supercritical fluid is directly gasified without going through a liquid phase. Accordingly, a problem of collapse in the pattern caused by the surface tension of a liquid inside the pattern is avoided.

The processed substrate S is carried out from the substrate processing unit 13A by the center robot 15 (Step S108). The processed substrate S which has been taken out is delivered from the center robot 15 to the indexer robot 22 (Step S109). The indexer robot 22 accommodates the substrate S in one of the containers C (Step S110). The container C for accommodating the processed substrate S may be a container in which the substrate S in an unprocessed state is accommodated or may be a different container.

When there are more substrates to be processed (YES in Step S111), the processing returns to Step S101, and the foregoing processing is executed for a next substrate S. When there are no more substrates to be processed (NO in Step S111), the processing ends.

Hereinabove, a flow of a case of processing one substrate S has been described. However, processing is executed for a plurality of substrates in parallel in an actual apparatus. That is, while one substrate S is subjected to processing inside one substrate processing unit, at least one of transfer of another substrate by the indexer robot 22, transfer of another substrate by the center robot 15, and substrate processing by a different substrate processing unit can be executed in parallel.

More specifically, for example, after the substrate S is delivered from the indexer robot 22 to the center robot 15 in Step S102, the indexer robot 22 can access the container C anew and can take out another substrate. In addition, for example, after one substrate S is carried into the substrate processing unit 11A in Step S103, the center robot 15 can carry another substrate into a different substrate processing unit or can carry out another substrate processed in a different substrate processing unit.

Therefore, when there is a need to sequentially perform processing for a plurality of substrates S, steps of processing for a plurality of substrates proceed in parallel by suitably adjusting an operation sequence of the units of the apparatus for processing the substrates S. Consequently, it is possible to improve a throughput of processing of the substrate processing apparatus 1 in its entirety. It is necessary for a specific operation sequence to be appropriately set in accordance with specifications of processing, a time required for each of the foregoing steps, whether or not to perform processing simultaneously, or the like.

Figure 9:
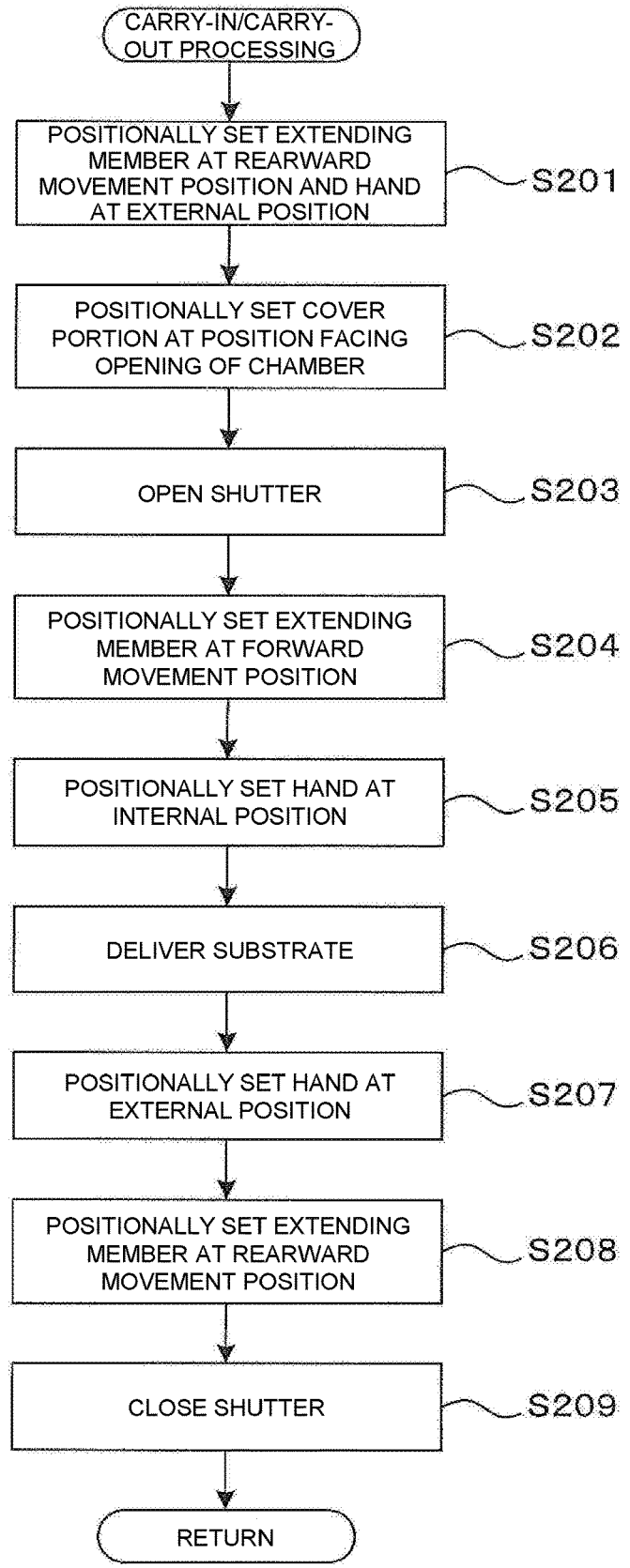
FIG. 9 is a flowchart showing carry-out processing and carry-in processing of a substrate with respect to the chamber.

FIG. 9 is a flowchart showing carry-out processing and carry-in processing of a substrate with respect to the chamber. This processing is executed as transfer processing (Step S106) in the foregoing operation of substrate processing. The transfer processing includes processing of carrying out the substrate S from the substrate processing unit 11A serving as a wet processing unit and processing of carrying the substrate S into the substrate processing unit 13A serving as a dry processing unit. Operation of each unit of the center robot 15 is basically the same between the two steps of processing. In the carry-out processing, the hand 155 enters the chamber in a state of holding no substrate S and returns while holding the substrate S. In contrast, in the carry-in processing, the hand 155 holding the substrate S enters the chamber and returns while leaving the substrate S behind. In this manner, although there is a difference in regard to the presence or absence of a substrate, a series of operation is the same.

In the initial state, the substrate holding unit 150 is positionally set at a suitable initial position. At this time, the extending member 1562 is positionally set at the rearward movement position, and the hand 155 is positionally set at the external position, respectively (Step S201). Therefore, the substrate holding unit 150 is in a state of being separated from the chamber. In addition, the hand 155 is accommodated in the cover portion 156. The hand 155 does not hold any substrate at this point of time in operation of carrying out the substrate S from the substrate processing unit 11A. On the other hand, the hand 155 holds the substrate S filled with a liquid at this point of time in operation of carrying the substrate S into the substrate processing unit 11A. Carry-in operation will be described below. Hereinafter, carry-out operation will be described first.

From this state, due to cooperative operation of the rotation mechanism and the upward/downward movement mechanism in response to a control command from the control unit 90, the substrate holding unit 150 is positionally set at a position facing the chamber 110 which is an access target. Specifically, the position of the substrate holding unit 150 is set such that an opening of the cover portion 156 is at a position facing an opening 112 of the target chamber 110 (Step S202). Since the extending member 1562 is at the rearward movement position and the hand 155 is at the external position, no interference occurs between the substrate holding unit 150 and the chamber.

Subsequently, the shutter 111 of the chamber 110 is opened (Step S203), and the extending member 1562 moves from the rearward movement position to the forward movement position and is positionally set thereat (Step S204). Consequently, the internal space SP of the cover portion 156 and the internal space SPc of the chamber 110 are connected to each other. The procedure thereof may be reversed. That is, the shutter 111 may be opened after the extending member 1562 is positionally set at the forward movement position.

From this state, the telescopic arm 154 extends so that the hand 155 enters the chamber 110 (Step S205). The hand 155 receives the substrate S from a mechanism inside the chamber 110 (Step S206). Regarding a method for delivering the substrate S between the processing mechanism inside the chamber and the hand, various methods are known, and an arbitrary method can be employed in the present embodiment as well.

After the substrate S is received, the telescopic arm 154 is folded, and the hand 155 is moved to the external position outside the chamber (Step S207). Accordingly, the substrate S can be carried out from the chamber 110. Next, the extending member 1562 moves rearward and is separated from the chamber 110 (Step S208). Then, the shutter 111 is closed (Step S209), and thus operation of carrying out the substrate S from the chamber 110 is completed. In this case as well, the extending member 1562 may be configured to be separated after the shutter is closed.

Subsequently, the substrate S is carried into the chamber 130 of the substrate processing unit 13A which is a main agent for executing a next step (dry processing). At this point of time, the substrate S in which a liquid film is formed on an upper surface is held by the hand 155 accommodated in the cover portion 156. The cover portion 156 is positionally set at a position facing the chamber 110. In the carry-in processing with respect to the chamber 130, processing similar to that described above is executed while having this state as an initial state. That is, the cover portion 156 moves and is positionally set at a position facing the chamber 130 which is an access target (Step S202), the shutter 111 is opened, and the extending member 1562 moves to the forward movement position (Steps S203 and S204). Accordingly, the cover portion 156 and the chamber 130 are coupled to each other.

In this state, the hand 155 enters the chamber 130 and delivers the substrate S to the processing mechanism inside thereof (Steps S205 and S206). Further, the hand 155 and the extending member 1562 sequentially move rearward and are separated from the chamber 130 (Steps S207 and S208). The shutter 131 is closed (Step S209), and thus operation of carrying the substrate S into the chamber 130 is completed.

In the carry-out processing and the carry-in processing, a liquid film is formed on the upper surface of the transferred substrate S. There is a possibility that a liquid spills from the substrate S or a liquid evaporates due to vibration or the like at the time of transfer. However, even in such an event, a liquid is retained in the internal space SP of the cover portion 156, and leakage of a liquid to the transfer space TS is avoided.

In the foregoing operation of carrying out the substrate S from the chamber 110, the hand 155 which enters the chamber 110 in Step S205 does not hold any substrate S. For this reason, leakage of a liquid cannot occur. In that sense, coupling (Step S204) of the internal spaces due to a forward movement of the extending member 1562 and decoupling (Step S208) thereof are not essential. Similarly, in the operation of carrying the substrate S into the chamber 130, the hand 155 which leaves the chamber 130 after carry-in processing does not hold any substrate S. Therefore, operation of the extending member 1562 is not necessarily essential.

In this manner, operation illustrated in FIG. 9 may be configured to omit Steps S204 and S208 depending on the situation. Consequently, operation similar to that described above can also be applied to processing in which the substrate S before a liquid film is formed is carried into the chamber 110 (Step S103 in FIG. 8) and processing in which the dried substrate S is carried out from the chamber 130 (Step S108 in FIG. 8). Naturally, the extending member 1562 may be operated even in such transfer having no risk of leakage of a liquid.

As described above, in this embodiment, the cover portion 156 covering the telescopic arm 154 and the hand 155 is provided in the center robot 15 transferring the substrate S between the chambers. Consequently, a liquid filling the substrate S is prevented from spilling and flowing out to the transfer space TS. For this reason, a liquid is prevented from adhering to various members disposed in the transfer space TS. Therefore, members disposed in the transfer space TS do not require high chemical resistance and high drip proofness. This also contributes to reduction in size and cost of the apparatus.

As described above, in the center robot 15 of the foregoing embodiment, the rotation base 152 and the rotation mechanism integrally function as "a swiveling mechanism" of the disclosure. In addition, the telescopic arm 154 (more specifically, the articulated arm 1542) functions as "an arm" of the disclosure, and the gas discharge mechanism 1592 corresponds to "a negative pressure supply unit" of the disclosure. In addition, the opening 1562a of the tip portion of the extending member 1562 corresponds to "an opening" of the disclosure.

In addition, the substrate processing apparatus 1 of the present embodiment functions as "a substrate processing apparatus" of the disclosure. In the substrate processing apparatus 1, the processing chamber 110 of the wet processing unit 11A corresponds to "a first chamber" of the disclosure. On the other hand, the processing chamber 130 of the dry processing unit 13A corresponds to "a second chamber" of the disclosure. Both of these correspond to "a chamber" of the disclosure. In addition, the chamber opening portion 112 and the like function as "a reception port" of the disclosure.

The disclosure is not limited to the foregoing embodiment and can be variously changed in a manner other than those described above within a range not departing from the gist thereof. For example, in the foregoing embodiment, in coupling between the cover portion 156 and the chamber 110 and the like, the tip portion of the extending member 1562 of the cover portion 156 is configured to abut the side surface of the chamber 110 with the seal member 1563 interposed therebetween. However, a form of connecting the internal space SP of the cover portion 156 and the internal space SPc of the chamber 110 is not limited thereto. For example, the following configuration can be adopted.

Figure 10A:
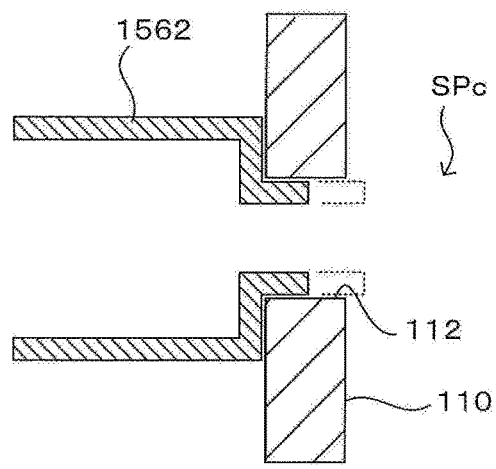
FIG. 10A is a view illustrating another form of connection between a cover portion and the chamber.
Figure 10B:
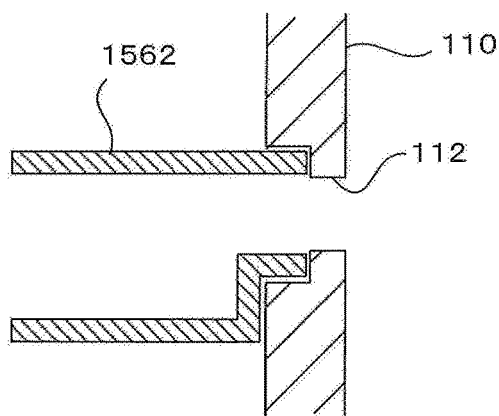
FIG. 10B is a view illustrating another form of connection between the cover portion and the chamber.
Figure 10C:
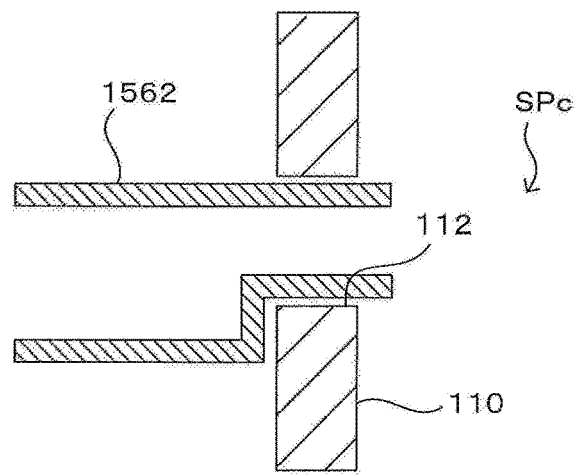
FIG. 10C is a view illustrating another form of connection between the cover portion and the chamber.

FIGS. 10A to 10C are views illustrating another form of connection between a cover portion and a chamber. A modification example is realized by a minor change in shape of at least one of the extending member 1562 and the chamber 110 of the foregoing embodiment. For this reason, the same reference signs as those in the foregoing embodiment are applied to the extending member and the chamber, and the description thereof will be omitted. For example, as illustrated in FIG. 10A, the tip portion of the extending member 1562 may be configured to enter the opening 112 on the chamber 110 side such that both are engaged with each other. In this case, as indicated by the dotted line, the tip of the extending member 1562 may extend to the internal space SPc of the chamber 110. In addition, as illustrated in FIG. 10B, the tip portion of the extending member 1562 may be configured to be engaged with a depression provided around the opening 112 on the chamber 110 side.

In addition, in regard to the purpose of simply avoiding leakage of a liquid to the transfer space TS, it is not necessarily for the extending member 1562 and the chamber 110 to abut each other. For example, as illustrated in FIG. 10C, as long as the tip of the extending member 1562 extends to the internal space SPc of the chamber 110, even if a liquid falls from the tip portion of the extending member 1562, the liquid is retained in the internal space SPc of the chamber and outflow of the liquid is avoided. Therefore, there is no problem even if there is a gap between the extending member 1562 and the chamber 110.

In addition, various kinds of chemical substances used in the processing of the foregoing embodiment are merely some examples. The chemical substances need only coincide with the foregoing technical idea of the disclosure, and various chemical substances can be used in place thereof.

As described above by exemplifying a specific embodiment, for example, the substrate processing apparatus according to the disclosure may include a swiveling mechanism that integrally swivels the arm and the cover main body with respect to the base portion. According to such a configuration, since a substrate held by the hand can be transferred a state of being accommodated inside the cover portion, the substrate can be transferred in various directions while outflow of a liquid is prevented.

In addition, for example, the tip portion of the extending member may have a shape for being engaged with a side wall of the chamber. According to such a configuration, outflow of a liquid is more reliably prevented due to the extending member and the side wall of the chamber which are engaged with each other.

In addition, for example, the cover main body may have a structure capable of storing a liquid in a bottom portion of the internal space. According to such a configuration, even if the liquid spills from a substrate, the liquid is retained inside the cover portion and outflow of the liquid can be prevented.

In addition, for example, the extending member may extend to the outside from the internal space of the cover main body. According to such a configuration, a telescopic movement of the cover portion can be realized by causing the extending member to be drawn out (or drawn in) with respect to the cover main body. In addition, even if a liquid falls from a substrate passing through the inside of the extending member, the liquid flows to the cover main body through the bottom surface of the extending member, and outflow to the outside is avoided.

In addition, for example, a negative pressure supply unit that supplies a negative pressure to the internal space may be provided. According to such a configuration, even if a liquid evaporates inside the cover portion, leakage of vapor thereof can be prevented.

In addition, for example, the hand may be configured to be moved forward and rearward between the internal position inside the chamber which the hand enters and the external position at which the hand is outside the chamber. The extending member may be configured to be moved horizontally between the forward movement position which is moved forward to the chamber side and the rearward movement position which is moved rearward to the cover main body side from the forward movement position. In addition, a control unit for realizing this operation may be further provided. Due to a combination of such operation, it is possible to achieve both access of the hand to the inside of the chamber and a movement and positional setting of the cover main body with respect to the chamber.

In addition, in the substrate processing apparatus according to the disclosure, for example, in each of the first chamber and the second chamber, a reception port for receiving entry of the hand may be provided in a side surface facing the base portion, and a tip portion of the extending member may have a shape for being engaged with the reception port. Due to the extending member on the cover portion side and the reception port on the chamber side which are engaged with each other, outflow of a liquid can be prevented effectively.

In addition, for example, the substrate processing apparatus may be configured to move the hand between the internal position and the external position in a state in which the extending member and the reception port are engaged with each other. According to such a configuration, even if a liquid spills from a substrate due to vibration or the like at the time of a movement of the hand, the liquid is retained in the internal space of any of the cover portion and the chamber, and outflow is avoided.

In addition, for example, the substrate processing apparatus may be configured to carry out a substrate from the first chamber in a state in which the extending member and the reception port of the first chamber are engaged with each other. A liquid film is formed on a substrate carried out from the first chamber, and the extending member and the reception port of the first chamber are engaged with each other when such a substrate is carried out. Therefore, even if the liquid spills from a substrate, outflow of the liquid is avoided.

In addition, for example, the substrate processing apparatus may be configured to carry a substrate into the second chamber in a state in which the extending member and the reception port of the second chamber are engaged with each other. A liquid film is formed on a substrate carried into the second chamber, and the extending member and the reception port of the second chamber are engaged with each other when such a substrate is carried in. Therefore, even if a liquid spills from a substrate, outflow of the liquid is avoided.

In addition, for example, the substrate processing apparatus may be configured to integrally move the arm and the cover main body with respect to the base portion in a state in which the extending member has retreated to the cover main body side. According to such a configuration, a substrate held by the hand can be transferred in a state in which the substrate is accommodated inside the cover portion, and outflow of a liquid which has spilt from the substrate during transfer is avoided.

In addition, for example, the substrate processing apparatus according to the disclosure may have a configuration in which a liquid film is formed on a substrate using an organic solvent in the first chamber, and the substrate is processed using a supercritical fluid in the second chamber. In substrate processing using a supercritical fluid, since a supercritical fluid has an extremely low surface tension, processing can also be performed for a substrate having a fine pattern without causing pattern collapse. On the other hand, since a high pressure is required, the second chamber has a peculiar structure so that it is difficult to provide a configuration for performing a previous step inside the second chamber. For this reason, it is necessary for a substrate to be transferred between the chambers in the processing process. In this case, it is effective to cover the substrate surface with a liquid film using an organic solvent in order to realize transfer without causing collapse in a fine pattern, and the disclosure can be suitably applied to conveyance of such a substrate.

As described above, the disclosure can be generally applied to a technology of substrate processing in which a substrate is transferred between a plurality of chambers executing different steps of processing a state in which the substrate surface is covered with a liquid film. For example, in exemplary embodiment, the disclosure is for processing in which a wet-processed substrate is dried through supercritical drying processing.

Although the disclosure has been described with reference to a specific embodiment, this description is not meant to be construed in a limiting sense. Various modifications of the disclosed embodiment, as well as other embodiments of the present disclosure, will become apparent to persons skilled in the art upon reference to the description of the disclosure. It is therefore contemplated that the appended claims will cover any such modifications or embodiments as fall within the true scope of the disclosure.

What is claimed is:

1. A substrate processing apparatus for transferring a substrate in which a liquid film is formed on an upper surface, the substrate processing apparatus comprising:
   a chamber;
   a base portion that is adjacent to the chamber;
   a hand that holds the substrate;
   an arm that is attached to the base portion and is capable of moving the hand forward and rearward with respect to the chamber by moving the hand in a horizontal direction with respect to the base portion; and
   a cover portion that has an internal space capable of accommodating the hand for holding the substrate and has an opening through which the hand moving forward and rearward in accordance with the arm passes on a side portion,
   wherein the cover portion has a cover main body forming the internal space and an extending member having a hollow structure which penetrates the cover portion in the horizontal direction and of which one end serves as the opening and being engaged with the cover main body in a state of being movable in the horizontal direction while the opening communicates with the internal space, and
   wherein the arm causes the hand to enter the chamber from the internal space via the opening in a state in which the extending member has moved forward to the chamber side.

2. The substrate processing apparatus according to claim 1 further comprising:
   a swiveling mechanism that integrally swivels the arm and the cover main body with respect to the base portion.

3. The substrate processing apparatus according to claim 1,
   wherein a tip portion of the extending member has a shape for being engaged with a side wall of the chamber.

4. The substrate processing apparatus according to claim 1,
   wherein the cover main body is capable of storing a liquid in a bottom portion of the internal space.

5. The substrate processing apparatus according to claim 1,
   wherein the extending member extends to the outside from the inside of the internal space of the cover main body.

6. The substrate processing apparatus according to claim 1 further comprising:
   a negative pressure supply unit that supplies a negative pressure to the internal space.

7. The substrate processing apparatus according to claim 1 further comprising:
   a control unit that
   causes the arm to move the hand forward and rearward between an internal position inside the chamber which the hand enters and an external position at which the hand is outside the chamber, and
   causes the extending member to move horizontally between a forward movement position which is moved forward to the chamber side and a rearward movement position which is moved rearward to the cover main body side from the forward movement position.

8. The substrate processing apparatus according to claim 1,
   wherein the arm and the cover main body integrally move with respect to the base portion in a state in which the extending member has retreated to the cover main body side.

9. The substrate processing apparatus according to claim 1 further comprising:
   a first chamber and a second chamber that serve as the chamber,
   wherein the substrate having the liquid film formed thereon is transferred from the first chamber to the second chamber.

10. The substrate processing apparatus according to claim 9,
    wherein processing of forming a liquid film on an upper surface of a substrate in a horizontal posture is executed inside the first chamber, and the second chamber receives the substrate having the liquid film formed thereon.

11. The substrate processing apparatus according to claim 9,
    wherein in each of the first chamber and the second chamber, a reception port for receiving entry of the hand is provided in a side wall facing the base portion, and a tip portion of the extending member has a shape for being engaged with the reception port.

12. The substrate processing apparatus according to claim 11,
    wherein the arm executes forward and rearward movement of the hand via the opening in a state in which the extending member and the reception port are engaged with each other.

13. The substrate processing apparatus according to claim 11,
    wherein the arm carries out the substrate from the first chamber in a state in which the extending member and the reception port of the first chamber are engaged with each other.

14. The substrate processing apparatus according to claim 11,
    wherein the arm carries the substrate into the second chamber in a state in which the extending member and the reception port of the second chamber are engaged with each other.

15. The substrate processing apparatus according to claim 9,
    wherein the liquid film is formed on the substrate using an organic solvent in the first chamber, and the substrate is processed using a supercritical fluid in the second chamber.

* * * * *